(12) United States Patent
Chang et al.

(10) Patent No.: US 8,646,280 B2
(45) Date of Patent: Feb. 11, 2014

(54) HEAT-POWER CONVERSION MAGNETISM DEVICES

(75) Inventors: Shao Hsiung Chang, Taoyuan Hsien (TW); Chii-How Chang, Taoyuan Hsien (TW)

(73) Assignee: Delta Electronics, Inc., Kuei San, Taoyuan Hsien (TW)

(*) Notice: Subject to any disclaimer, the term of this patent is extended or adjusted under 35 U.S.C. 154(b) by 667 days.

(21) Appl. No.: 12/884,855

(22) Filed: Sep. 17, 2010

(65) Prior Publication Data

US 2011/0062821 A1    Mar. 17, 2011

Related U.S. Application Data

(60) Provisional application No. 61/243,369, filed on Sep. 17, 2009.

(51) Int. Cl.
*F25B 21/00* (2006.01)
*H02N 10/00* (2006.01)

(52) U.S. Cl.
USPC .............................. 62/3.1; 310/306

(58) Field of Classification Search
USPC .............................. 62/3.1; 310/306
See application file for complete search history.

(56) References Cited

U.S. PATENT DOCUMENTS

| | | | |
|---|---|---|---|
| 396,121 A * | 1/1889 | Tesla | 310/306 |
| 428,057 A * | 5/1890 | Tesla | 310/306 |
| 476,983 A * | 6/1892 | Edison | 310/306 |
| 3,445,740 A * | 5/1969 | Merkl | 318/117 |
| 4,638,194 A * | 1/1987 | Keefe | 310/40 R |
| 5,742,106 A * | 4/1998 | Muraji | 310/36 |
| 6,906,446 B2 * | 6/2005 | Post | 310/191 |
| 2008/0078184 A1 * | 4/2008 | Saito et al. | 62/3.1 |
| 2009/0091411 A1 * | 4/2009 | Zhang et al. | 335/306 |
| 2010/0071383 A1 * | 3/2010 | Zhang et al. | 62/3.1 |
| 2011/0041514 A1 * | 2/2011 | Heitzler et al. | 62/3.1 |

FOREIGN PATENT DOCUMENTS

JP    2010-101576 A  *  5/2010  ............ F25B 21/00

* cited by examiner

*Primary Examiner* — Burton Mullins
(74) *Attorney, Agent, or Firm* — Muncy, Geissler, Olds & Lowe, PLLC

(57) ABSTRACT

The invention discloses a heat-power conversion magnetism device. The heat-power conversion magnetism device includes a magneto caloric effect material so that the magnetic field thereof can be changed according to the temperature difference. The heat-power conversion magnetism device rotates by changing the magnetic field of the magneto caloric effect material.

2 Claims, 24 Drawing Sheets

| Step | \multicolumn{3}{c}{TMFG temperature} | | | | |
|---|---|---|---|---|---|---|
|  | u1,u4 | u2,u5 | u3,u6 | u1,u4 | u2,u5 | u3,u6 |
| 1 | H | L | L | H | L | L |
| 2 | L | L | H | L | H | L |
| 3 | L | H | L | L | L | H |
| 4 | H | L | L | H | L | L |
| 5 | L | L | H | L | H | L |
| 6 | L | H | L | L | L | H |
|  | \multicolumn{3}{c}{CCW direction} | \multicolumn{3}{c}{CW direction} | |

H: High temperature, above Tc
L: Low temperature, below Tc

HEAT-POWER CONVERSION MAGNETISM DEVICES

CROSS REFERENCE TO RELATED APPLICATIONS

The present application claims the benefit of U.S. provisional application entitled "HEAT-POWER CONVERSION MAGNETISM DEVICE", Ser. No. 61/243,369, filed Sep. 17, 2009.

BACKGROUND OF THE INVENTION

1. Field of the Invention

The invention pertains to the field of a conversion magnetism device. More particularly, the invention pertains to a heat-power conversion magnetism device.

2. Description of the Related Art

Converting thermal energy into power had a long period of time in human history. Especially the converting thermal energy into electrical power is the most common energy source today. However, the efficiency of conversion is still very low. For example, the efficiency is about 40% for steam power plant and about 30% for internal combustion engine. Almost 60-70% of energy is wasted. After power conversion, the remained energy becomes too low so that the temperature thereof is usually below 200° C. and mostly below 100° C. Such kind of low-grade energy cannot be utilized by most of the thermal engine available today.

Taking the solar energy as an example, the sunshine provides huge amount of energy to earth but the energy density is one KW per square meter only. Flat panel of sunshine collector can convert solar energy into hot thermal energy very efficiently (>90%) and cost effectively, but the thermal energy density is very low. Usually the temperature of flat panel solar hot water system is below 100° C.

To convert low grade of energy (<100° C.) into useful mechanical power by appropriate utilization of the magneto caloric effect (MCE) of solid ferromagnetic materials is desirable.

Magneto caloric effect (MCE) has been discovered for over 100 years. Emil Gabriel Warburg discovered the magneto caloric effect in the iron in 1881. Soon after Warburg's discovery, Edison and Tesla tried to convert power from the magneto caloric effect of soft iron by heating and cooling, as disclosed in U.S. Pat. No. 396,121, U.S. Pat. No. 428,057, and U.S. Pat. No. 476,983. For a very long period of time, such technology was only applied in very low temperature refrigeration to cool down sample to few Kelvin to tens Kelvin since 1930's. For near room temperature magnetic refrigeration was not able to achieve until 1976. Gadolinium (Gd) has been used as a magnetic working material and demonstrated the magnetic refrigeration at near room temperature in 1976. Gd, which has a Curie point of 293 Kelvin, is used as a working material by G. V. Brown of National Aeronautics and Space Administration. The temperature change of 14° K has been produced by applying 7T magnetic field. Since then the study of the application of MCE materials has been increased, a lot of MCE material properties can be found in the disclosure of K. A. Gschneidner Jr, V. K. Pecharsky, "Recent developments in magnetocaloric materials", Institute of Physics Rublishing, Reports on Progress in Physics, Rep. Prog. Phys. 68 (2005) 1479-1539.

In 1997, V. K. Pecharsky and K. A. Gschneidner discovered that the entropy change ($\Delta S$) of $Gd_5(Si_xGe_{1-x})_4$ is much larger then Gd in near room temperature and the Curie temperature thereof can be changed from 29 Kelvin to 290 Kelvin by changing the composition of Si and Ge. $Gd_5(Si_xGe_{1-x})_4$ can be a desirable magneto caloric effect material (MCEM).

The basic principle of magneto caloric effect can be used as the magnetic refrigeration (or heat pump), which is disclosed in Peter W. Egolf, Andrej Kitanovski, "An introduction to magnetic refrigeration", University of Applied Sciences of Western Switzerland; C. Zimm, A. Jastrab, "Description and Performance of a Near-Room Temperature Magnetic Refrigerator", Advances in Cryogenic Engineer, Vol. 43; and G. V. Brown, "Magnetic heat pumping near room temperature", Journal of Applied Physics, Vol. 47, No. 8, August 1976, also we can find the basic theory of magnetic cooling in the disclosure Andrej Kitanovski, Peter W. Egolf, "Thermodynamics of magnetic refrigeration", International Journal of Refrigeration 29 (2006) 3-21.

For an reversible adiabatic process and from Maxwell equation, the equations are disclosed as the following:

$$\Delta S_m = -\int \mu_0 (\partial M/\partial T) dH \qquad (1)$$

wherein $S_m$ is magnetic entropy; $\mu_o$ is permeability of vacuum; M is magnetic moment; T is temperature; and H is magnetic field strength;

$$\Delta T_{ad} = -\int (T/C_p)(\partial M/\partial T) dH \qquad (2)$$

wherein $\Delta T_{ad}$ is adiabatic temperature change and $C_p$ is heat capacity; and $$\Delta S_m * T = C_p * \Delta T_{ad} \qquad (3)$$

When a magnetic field is applied to the MCEM and the MCEM is magnetized, the magnetic entropy, $S_m$, is changed according to the magnetic field changed by the magnetic order of the material. Under the adiabatic condition, the magnetic entropy change, $\Delta S_m$, must be compensated by an opposite change of the entropy associated with the lattice. The result is a change in temperature of the MCEM. In other words, when a magnetic field is applied to MCEM and loss its magnetic entropy, the temperature of the MCEM rise up to compensate the magnetic entropy loss. When the magnetic field is removed away from the MCEM and increase its magnetic entropy, the temperature of the MCEM cool down to compensate the magnetic entropy increase.

By using MCEM together with proper thermal dynamic cycles, some heat engine for cooling, or heating, can be designed.

There are four basic processes for MCE magnetic heat engine: (A) adiabatic magnetization: a magneto caloric effect material is subjected to magnetic field in adiabatic condition, and the temperature of the material rises up; (B) constant magnetic field cooling: a cold thermal heat source is provided to cool the material to low temperature; (C) adiabatic demagnetization: magnetic field is removed away from the material in an adiabatic condition, and temperature of the material goes down; and (D) zero magnetic field heat absorption: a hot thermal heat source is provided to heat the material. For cooling application, the process (D) is used to cool the environment. For heating application, the process (B) is used to warm the environment.

From this equation, we can know that the magnetic entropy change of MCEM is relative to the $(\partial M/\partial T)$. The larger $(\partial M/\partial T)$ of the material is, the larger entropy change is, which will induce larger cooling capacity of magnetic thermal cycles. For the magnetic cooling (heat pump) application, the magnetic field is chosen to change the magnetic phase of MCEM, and the result is the change of magnetic entropy and eventually the change of temperature. The more largely the magnetic moment changes, the larger cooling capacity will be achieved.

When dealing with heat-power conversion, the thermal energy is chosen to change the magnetic moment of MCEM, and the result is the power generation. For most of the MCEM, as the heat is applied to the MCEM and the temperature pass through the Curie temperature, the magnetic moment will change from high to low. Assume that a magnetism device with MCEM has been designed and allowed the magnetic flux flowing through the MCEM. When the thermal energy is applied to the MCEM and change its magnetic moment, the magnetic flux will be changed due to the magnetic moment change.

The magneto caloric effect material (MCEM) is not only suitable for the magnetic refrigeration application, it also suitable for the reverse processing which is the heat-power conversion application.

U.S. Pat. No. 396,121, U.S. Pat. No. 428,057, and U.S. Pat. No. 476,983 show the earlier ideas of heat-power conversion device. Although those prior arts give some great ideas of how to change the thermal energy into the mechanical work or electrical power but it never come to realization. It requires huge amount of energy to rise the temperature up to the Curie temperature, and efficiency is low. Simply because of the near room temperature, a magneto caloric effect material (MCEM) had not been discovered until 1970's. U.S. Pat. No. 396,121 also require spring or flywheel as mechanical energy storage device to complete the cycle. Also the armature moves forward and backward like a pendulum, which is not an efficient way for power generation.

Both U.S. Pat. No. 428,057 and U.S. Pat. No. 476,983 require electric conductor coil for electrical power generation. When the temperature of the magnetic core is changed between its Curie temperatures, the magnetic moment will be changed and cause the magnetic flux to change, thus the induced electrical current flows through the electric conductor coil. Another report in the disclosure of Paul F. Massier, C. P. Bankston, ECUT, Energy Conversion and Utilization Technologies Program "Direct Conversion Technology", Annual Summary Report CY1988, Dec. 1, 1988a also introduces electric conductor coil for electrical power generation. The problem of electric conductor coil is that the power generation of the coil strongly depends on the magnetic flux changing frequency. The thermal transfer process for changing the magnetic moment of MCEM is a slow procedure, and the cycle time is 6 seconds (0.166 Hz) in the report of Reference of C. Zimm, A. Jastrab, "Description and Performance of a Near-Room Temperature Magnetic Refrigerator", Advances in Cryogenic Engineer, Vol. 43. Another report of Dr. Zimm of Astronautics Corporation shows the operation frequency of 4 Hz. Being under such low operation frequency will limit the electrical power output of electric conductor coil and waste large amount of MCEM to convert enough power.

U.S. Pat. No. 4,447,736 discloses the rotary magneto caloric ring system schematic. In this system, the MCEM forms a ring shape and rotates in the center of the ring. An extra magnet covers certain portion of ring, and hot heat exchanger and cold heat exchanger are applied to the rotation ring. A part of the rotating ring is being heated by hot heat exchanger, and a part of the rotation ring which is outside the magnetic field bounds is being cooled. The cooled portion of rotary magneto caloric ring, which the temperature is under its Curie temperature, will be attracted by the magnetic field. Such kind of rotary magneto caloric ring system schematic can provide a continuous smooth mechanical torque output. However it is difficult to utilize all the magnetic flux generated by the magnet, and only a part of the magneto caloric ring is attracted by the magnet, thus the mechanical torque output is relative low. Also how to prevent the leakage of the refrigerant between the heat exchanger and the rotary magneto caloric ring became a very difficult issue.

Some interesting magnetic cooling or heating devices for generating a thermal flux with magneto caloric materials are disclosed in U.S. Publication No. 2007/0130960 and No. 2008/0236172. Permanent magnets are used to generate magnetic field and multiple number of magneto caloric effect materials (MCEM) are used so that MCEMs are subjected to a variation in magnetic field. In order to generate strongest magnetic field as possible, a number of MCEMs are arranged as a multiple number of magnets. The location arrangement of magnetic poles of magnet and the MCEMs are well-aligned, and the magnetic flux can pass through the magnetic paths as smooth as possible. In other words, the magnetic resistance of magnetic paths is designed to be minimized. For the first example of U.S. Publication No. 2007/0130960, twelve thermal bodies made of MCEM and six magnetic elements are used. Such arrangement can allow the minimum magnetic resistance and maximum magnetic flux pass through the MCEMs when they are aligned. Although such arrangement can create the maximum thermal effect of the MCEMs, but it also leads to extra problem. The static torque is also large and requires more driving power to move the magnetic field away from the MCEMs.

Both U.S. Pat. No. 6,668,560 and U.S. Pat. No. 6,935,121 show a rotating magnet magnetic refrigerator. Both a number of magneto caloric material is a common multiple of the number of magnetic poles, and the attraction force at neutral position is large, thus the torque require to overcome the attraction force is large.

An MCEM is the temperature dependency of magnetization. Cleber Santiago Alves, Sergio Gama, "Giant Magnetocaloric effect in $Gd_5(Si_2Ge_2)$ Alloy with Low Purity Gd" and E. Bruck, O. Tegus, "Magnetic refrigeration—towards room-temperature application", Physica B 327 (2003) 431-437 show the magnetization curves of Gd, $Gd_5Si_2Ge_2$, and MnFe (P,As) at near room temperature.

FIG. 1. shows magnetization curves of Gadolinium (Gd); FIG. 2. shows magnetization curves of $Gd_5Si_2Ge_2$; FIG. 3 shows magnetization curves of $(Mn, Fe)_2P_{0.5}As_{0.5}$; and FIG. 4 shows MCE of MnFePAs in 2T and 5T magnetic field.

The materials in FIGS. 2 and 3 show the dramatically magnetic moment change when the temperature of the materials changes around its Curie temperature (Tc). Such kinds of materials are perfectly suitable for heat and mechanical power conversion. FIG. 4. shows the entropy change calculated by the equation (1).

When a MCE material is subjected to magnetic field, large magnetic property (magnetic moment) changing occurs over relatively small temperature changes near the Curie temperature. Referring to FIG. 4, it is much clear to understand how the magnetic phase changes corresponding to the temperature. At 2T magnetic field strength, the magnetic phase changes completely when the changing temperature (around 12 Kelvin) is between $T_{low}$ and $T_{high}$.

If a heat source temperature is 10 Kelvin higher then Tc, it will be enough to change the magnetic moment from high to low. Taking the FIG. 4 as an example, the Curie temperature of the material is 280 Kelvin, the hot heat source of 290 Kelvin and cold heat source of 275 Kelvin will be enough to change the magnetic moment between $T_{high}$ and $T_{low}$.

Such kind of hot heat source can be found everywhere in our ordinary life. The disclosure of Andrej Kitanovski, Marc Diebold, "Applications of Magnetic "Power Production: and its assessment", Final Report, Swiss Federal Office of Energy—BFE, 2007 shows some of the type of heat source, for example solar, geothermal, vehicle or industry processes, and the temperature range from 60° C. to 180° C. The invention intends to convert such low-grade of thermal energy into useful mechanical power efficiency.

BRIEF SUMMARY OF THE INVENTION

A new kind of heat-power conversion technology is introduced in the invention. This invention intend to achieve the goal as below:

1. Converting a very low temperature heat source (<100° C.) into useful power;
2. Without using electric conductor coil for power generation;
3. Simplifying rotation magnetic mechanism design; and
4. Having high thermal efficiency.

Now, two important basic rules are understudied and will be used commonly in this invention as the following.

(1) The temperature of a magneto caloric effect material over its Curie temperature will influence the magnetic properties and the magnetic moment of the material at low level. The magnetic property is more like a paramagnetism material.

(2) The temperature of the magneto caloric effect material below its Curie temperature will influence the magnetic properties and the magnetic moment of the material at high level. The magnetic property is more like a ferromagnetism material.

These two basic rules will be used frequently in this invention.

An exemplary embodiment of a heat-power conversion magnetism device comprises a sleeve, a magnet, and a plurality of magneto caloric effect material units. The magnet is disposed at a center area of the sleeve and has at least one pair of magnetic poles. The plurality of magneto caloric effect material units are disposed between the sleeve and the magnet.

Another exemplary embodiment of a heat-power conversion magnetism device comprises a sleeve, a plurality of magnets, a core, and a plurality of magneto caloric effect material units. The plurality of magnets are disposed at an inner face of the sleeve. The core is disposed at a center area of the sleeve. The plurality of magneto caloric effect material units are disposed between the sleeve and the core.

Another exemplary embodiment of a heat-power conversion magnetism device comprises a magnet ring, a core, and a plurality of magneto caloric effect material units. The core is disposed at a center area of the magnet ring. The plurality of magneto caloric effect material units are disposed between the magnet ring and the core.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 5A:
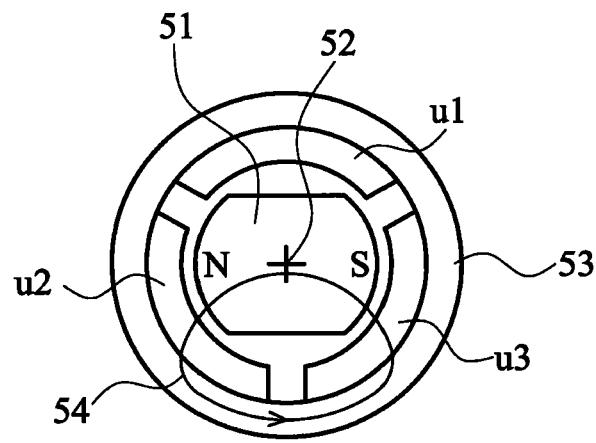
FIGS. 5A-5C show rotating steps illustrated by cross-sectional views of a rotating magnet heat-power conversion magnetism device according to an embodiment of the present invention.
Figure 5B:
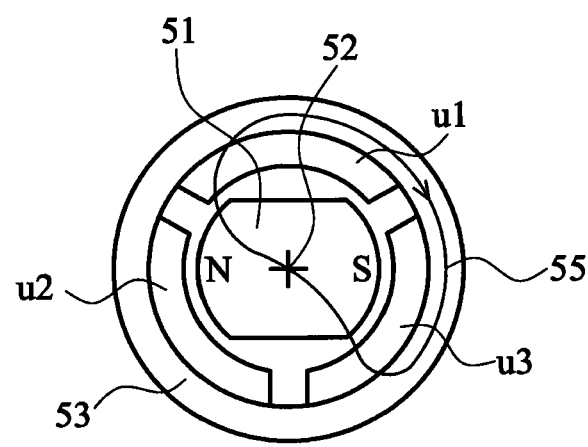
Figure 5C:
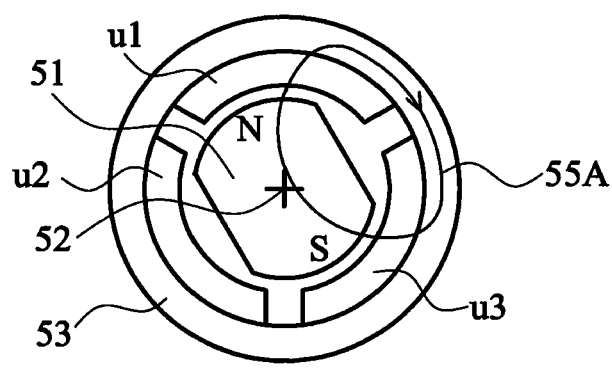

FIGS. 5A, 5B and 5C show rotating steps illustrated by cross-sectional views of a rotating magnet heat-power conversion magnetism device 50 according to an embodiment of the present invention. The rotating magnet heat-power conversion magnetism device 50 includes a magnet 51 having an axis 52 and disposed in a sleeve 53. The magnet 51 having two magnetic poles can rotate along the axis 52. The sleeve 53 is made of a high permeability magnetic material. Three magneto caloric effect material (MCEM) units u1, u2, and u3 are located at the inner face of the sleeve 53, i.e., the plurality of the MCEM units u1-u3 are arranged between the magnet 51 and the sleeve 53.

As shown in FIG. 5A, external hot thermal energy is applied to the MCEM unit u1, and the magnetic moment of the MCEM unit u1 is changed to a low magnetic moment state. At the same time, external cold energy is applied to the MCEM units u2 and u3 so that the magnetic moment of the MCEM units u2 and u3 is changed to a high magnetic moment state. Multi paths of magnetic flux are therefore generated. For example, a magnetic flux path 54, as shown in the drawing, flows from the magnet 51 through the unit u2, the sleeve 53, and the unit u3 and then returns to the magnet 51. The conversion magnetism device 50 now is in a static state and maintains the magnet 51 in a horizontal position with the lowest magnetic resistance.

In FIG. 5B, external hot thermal energy is applied to the MCEM unit u2, and external cold thermal energy is applied to the MCEM units u1 and u3. Now the magnetic flux has difficulty to flow through the MCEM unit u2 since the magnetic moment of the MCEM unit u2 is changed to a low magnetic moment state and the magnetic resistance is relatively high. Multi paths of magnetic flux are therefore changed, in other words, a new magnetic flux path 55 shown in the drawing is generated. The Magnetic flux path 55 originates from the magnet 51 through the MCEM unit u1, the sleeve 53, and the unit u3. The MCEM units u1 and u3 attract the N and S poles of the magnet 51, and then the magnetic attraction force intends to rotate the magnet 51 in a clockwise (CW) direction to reach a new lowest magnetic resistance of the conversion magnetism device 50.

In FIG. 5C, the magnet 51 rotates to a new location, and the magnetic resistance thereof is maintained at the lowest state. When the MCEM units absorb or expel thermal energy, the magnetic property thereof will be changed. The MCEM units function like a thermal magnetic flux gate (TMFG) and control the flowing of magnetic flux. The temperature change of the MCEM units will cause the distribution change of magnetic flux so that the magnetic resistance of the conversion magnetism device 50 is changed. Continuous changing of the temperature of the MCEM units u1-u3 will cause continuous rotation of the magnet 51 and generate mechanical power through the axis 52.

The MCEM units u1-u3 function like a magnetic flux switch for turning the magnetic flux on and off. Also the MCEM units can be used as an analog magnetic flux valve for controlling the amount of magnetic flux analogically. Sequentially controlling the MCEM units u1-u3 by the thermal energy will change the magnetic resistance of the conversion magnetism device 50 so that the center axis 52 rotates to generate mechanical torque output.

One example can be illustrated to explain the reason why the conversion magnetism device of the present invention will keep looking for its lowest magnetic resistance. Assume that we put a steel ball in a bowl, the steel ball will always try to move to the lowest location, which is similar to the lowest potential energy of the system of the present invention. When the bowl is tilted, the steel ball will move to the new lowest location again to reach its lowest potential energy of the system. That is, the conversion magnetism device will keep the magnetic resistance to be at its lowest state, when we change the temperature of the MCEM units that will break the balance of the magnetic resistance. The conversion magnetism device will try to move to a new state, in which the magnetic resistance is the lowest.

Figure 6:
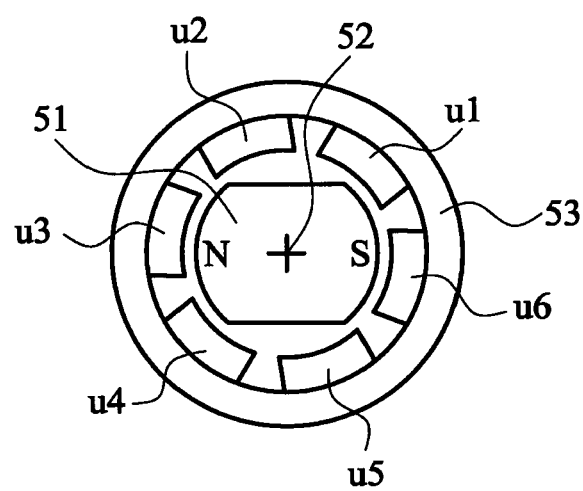
FIG. 6 shows cross-sectional views of a rotating magnet heat-power conversion magnetism device according to another embodiment of the present invention.

FIG. 6 shows a cross-sectional view of a rotating magnet heat-power conversion magnetism. device 50A according to another embodiment of the present invention. The structure of the conversion magnetism device 50A is similar to that of the conversion magnetism device 50 shown in FIGS. 5A-5C. The difference is that six MCEM units u1, u2, u3, u4, u5 and u6 are arranged between the magnet 51 and the sleeve 53 and disposed at the inner face of the sleeve 53.

The following steps illustrate a continuing rotation of the conversion magnetism device 50A:
(1) First, the MECM units u6 and u3 are at the temperature below its Curie temperature (Tc), and the other MCEM units u1, u2, u4, and u5 are at the temperature above its Tc. The magnet 51 will stay at position with the lowest magnetic resistance. That is, the magnet 51 is attracted by the MCEM units u3 and u6 to keep the horizontal position shown in FIG. 6.
(2) Then, hot thermal energy is applied to the MCEM units u1, u4, u3, and u6, and, at the same time, cold thermal energy is applied to the MCEM units u2 and u5. The N and S poles of the magnet 51 then will be attracted by the MCEM units u2 and u5 and rotate in a clockwise direction to the new lowest magnetic resistance position. The N pole of the magnet 51 will reach the position close to the MCEM unit u2, and the S pole of the magnet 51 will reach the position close to the MCEM unit u5.
(3) Then, hot thermal energy is applied to the MCEM units u2, u3, u5, and u6, and, at the same, cold thermal energy is applied to the MCEM units u1 and u4. Then the N and S poles of magnet 51 will be attracted by the MCEM units u1 and u4 respectively, so that the N and S poles rotate again in the clockwise direction to the new lowest magnetic resistance position close to the MCEM units u1 and u4 respectively.

The steps (1)-(3) can be repeated to force the magnet 51 to rotate in the clockwise direction continuously so that the mechanical power can be generated.

The following sequences of changing the temperature of the MCEM units can force the magnet 51 to rotate to generate the mechanical power.
(A) Cooling sequence: the MCEM units u1 and u2→the MCEM units u3 and u4→the MCEM units u5 and u6→the MCEM units u1 and u2 . . . .
(B) Cooling sequence: the MCEM units u3 and u6→the MCEM units u1, u3, u4, and u6→the MCEM units u1 and u4→the MCEM units u1, u2, u4, and u5→the MCEM units u2 and u5→the MCEM units u2, u3, u5, and u6→the MCEM units u3 and u6 . . . .
(C) Cooling sequence: the MCEM units u3, u4, u5, and u6→the MCEM units u1, u3, u4, and u6→the MCEM units u1, u4, u5, and u6→the MCEM units u1, u2, u4, and u5→the MCEM units u1, u2, u5, and u6→the MCEM units u2, u3, u5, and u6→the MCEM units u1, u2, u3, and u6→the MCEM units u1, u3, u4, and u6→the MCEM units u1, u2, u3, and u4→the MCEM units u1, u2, u4, and u5 the MCEM units u2, u3, u4, and u5→the MCEM units u2, u3, u5, and u6→the MCEM units u3, u4, u5, and u6 . . . .

By sequentially controlling the temperature of the MCEM units u1-u6, we can force the magnet 51 to rotate continually. Then the mechanical torque is generated through the axis 52.

Figure 7A:
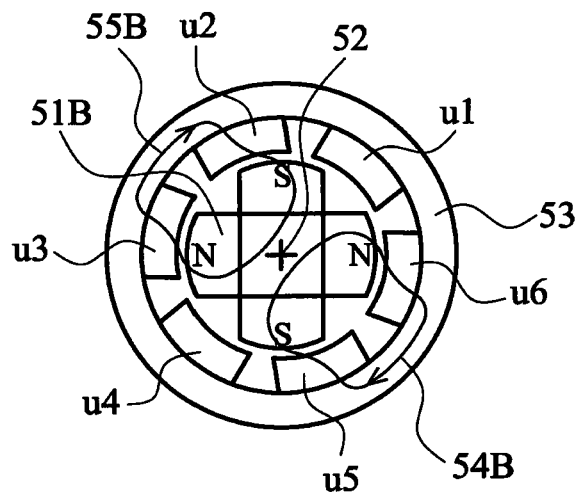
FIGS. 7A-7C show rotating steps illustrated by cross-sectional views of a rotating magnet heat-power conversion magnetism device according to another embodiment of the present invention.
Figure 7B:
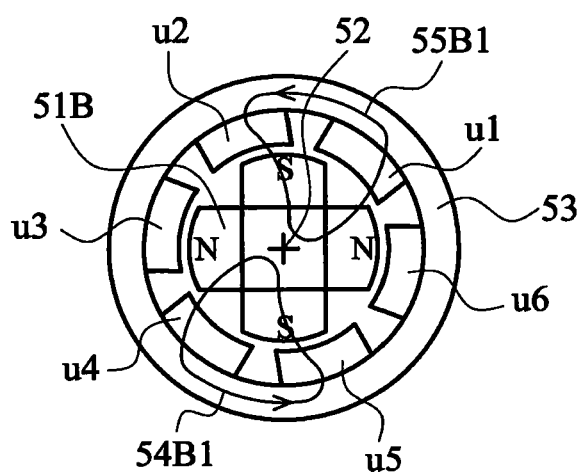
Figure 7C:
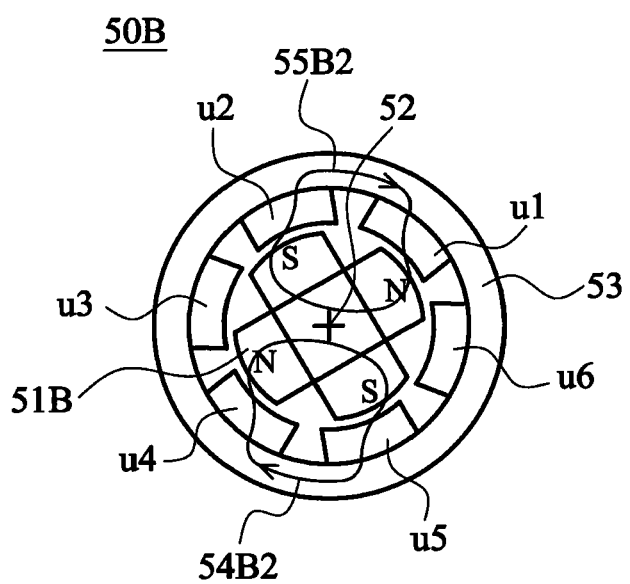

FIGS. 7A, 7B and 7C show rotating steps illustrated by cross-sectional views of a rotating magnet heat-power conversion magnetism device 50B according to another embodiment of the present invention. The structure of the conversion magnetism device 50B is similar to that of the conversion magnetism device 50A shown in FIG. 6. The difference is that the magnet 51B has two N magnetic poles and two S magnetic poles.

As shown in FIGS. 7A-7C, two major magnetic flux paths 54B and 55B are generated because of the four magnetic poles (two N poles and two S poles). The following steps illustrate a continuing rotation of the conversion magnetism device 50B:
(1) In FIG. 7A, the MCEM units u2, u3, u5, and u6 are at a cold temperature state, and the MCEM units u1 and u4 are at a warm temperature state. The magnetic flux paths 55B and 54B flow through the MCEM units u2 and u3 and the MCEM units u5 and u6, respectively. The position of the device 50B shown in FIG. 7A illustrates the lowest magnetic resistance.

(2) As shown in FIG. 7B, the temperature of the MCEM units u1 and u4 are cooled down, and the temperature of the MCEM units u3 and u6 are heated up so that the magnetic flux paths 54B1 and 55B1 are generated and different from the magnetic flux paths 55B and 54B shown in FIG. 7A. The MCEM units u1, u2, u4, and u5 attract the magnetic poles of the magnet 51B so that the axis 52 rotates in a counterclockwise (CCW) direction and stays at the position shown in FIG. 7C. Two magnetic flux paths 54B2 and 55B2 are generated in FIG. 7C.

(3) The temperature of the MCEM units u3 and u6 are lower, and the temperature of the MCEM units u2 and u5 are higher so that the magnetic flux paths are changed, and the axis 52 rotates in the counterclockwise direction (not shown in the drawing).

Sequentially changing the temperature of the MCEM units will force the magnet 51 to rotate along the axis 52 in the counterclockwise direction and to generate mechanical power. The reverse sequence of the temperature variation will force the magnet 51 to rotate alone the axis 52 in different direction.

Figure 8:
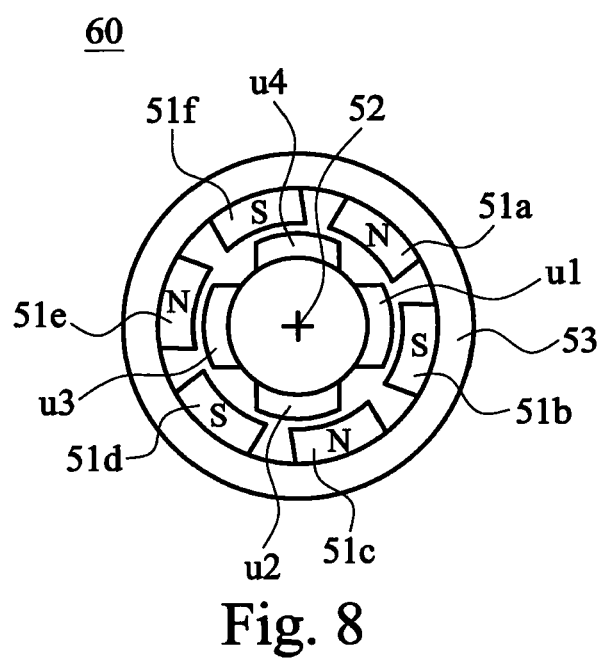
FIG. 8 shows a cross-sectional view of the other embodiment of the rotating magnet heat-power conversion magnetism device.

FIG. 8 shows a cross-sectional view of a rotating magnet heat-power conversion magnetism device 60 including a core 66 with an axis 52 and disposed in a sleeve 53. The core 66 and the sleeve 53 are made of a high permeability magnetic material. The MCEM units are disposed at the outer face of the core 66, and a plurality of magnets are disposed at the inner face of the sleeve 53 so that the magnets and the MCEM units face each other. Four MCEM units u1, u2, u3, and u4 and six magnets 51a, 51b, 51c, 51d, 51e, and 51f are shown in the drawing. Each of the magnets 51a, 51c, and 51e has an N pole, and each of the magnets 51b, 51d, and 51f has an S pole. The N and the S poles are disposed alternately. The rotation mechanism of the device 60 is similar to that of the device 50B shown in the FIGS. 7A-7C so that the illustration thereof is omitted.

FIGS. 9A-9F show cross-sectional views of embodiments with different arrangements of magneto caloric effect material units of a rotating magnet heat-power conversion magnetism device.

Figure 9A:
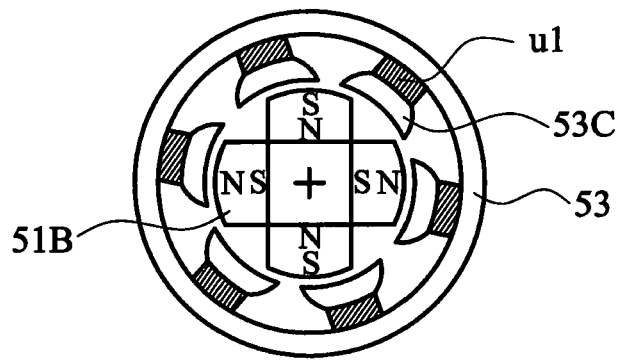
FIGS. 9A-9F show embodiments with different arrangements of magneto caloric effect material units of a rotating magnet heat-power conversion magnetism device of the present invention.

As shown in FIG. 9A, the rotating magnet heat-power conversion magnetism device 70A includes a plurality of the MCEM units u1 disposed at the inner face of the sleeve 53. A magnetic conductor 53C is connected to the MCEM unit u1 to face the magnet 51B. The sleeve 53 and the magnetic conductor 53C are made of a high permeability magnetic material.

Figure 9B:
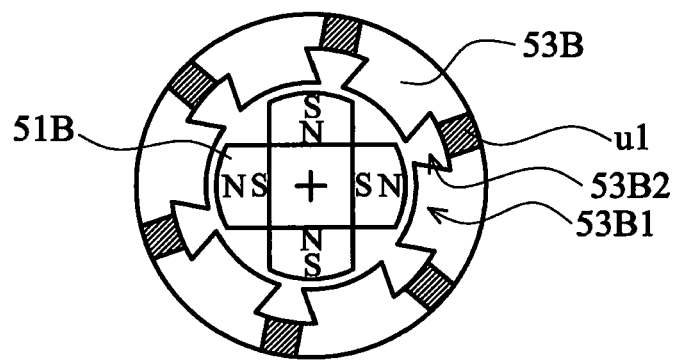

In FIG. 9B, the rotating magnet heat-power conversion magnetism device 70B includes a magnet 51B disposed in a sleeve 53B. The protrusions 53B1 are formed on the inner face of the sleeve 53B. A recess 53B2 is formed between two adjacent protrusions 53B1. An MCEM unit u1 is disposed at the bottom of the recess 53B2.

Figure 9C:
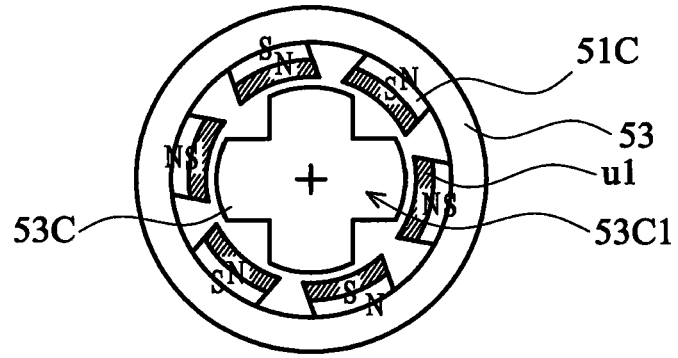

In FIG. 9C, a rotating magnet heat-power conversion magnetism device 70C includes a core 53C disposed in the sleeve 53 and having a plurality of protrusions 53C1. A plurality of magnets 51C are disposed at the inner face of the sleeve 53. An MCEM unit u1 is disposed on each of the magnets 51C. As shown in the drawing, six MCEM units u1 are disposed between the six magnets 51C and four protrusions 53C1 of the core 53.

Figure 9D:
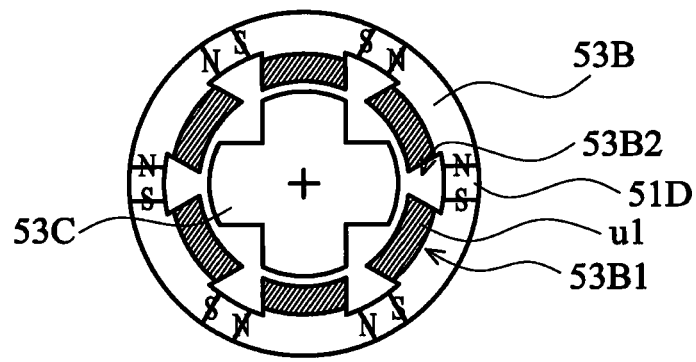

In FIG. 9D, a rotating magnet heat-power conversion magnetism device 70D includes a core 53C disposed in the sleeve 53B. A plurality of protrusions 53B1 are formed on the inner face of the sleeve 53B. A recess 53B2 is formed between two adjacent protrusions 53B1. A MCEM unit u1 is disposed on the protrusion 53B1. The magnet 51D is disposed at the bottom of the recess 53B2.

Figure 9E:
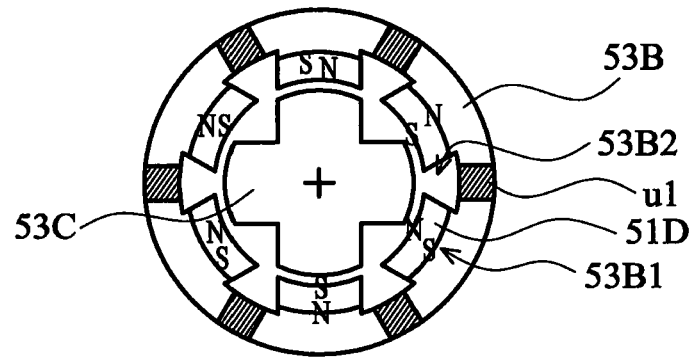

A rotating magnet heat-power conversion magnetism device 70E shown in FIG. 9E is similar to the device 70D shown in FIG. 9D. The difference is that the magnet 51D is disposed on the protrusion 53B1 and that the MCEM unit u1 is disposed at the bottom of the recess 53B2.

Figure 9F:
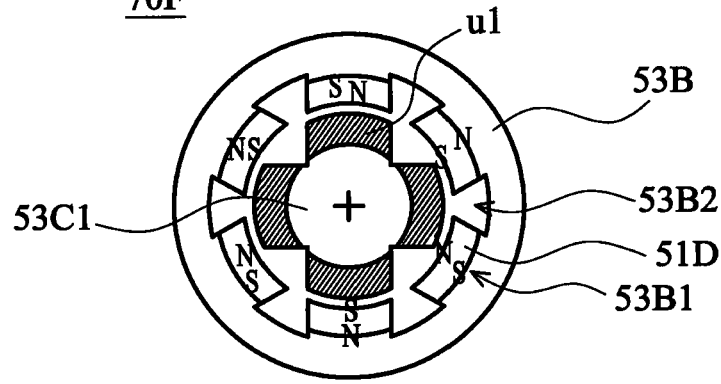

A rotating magnet heat-power conversion magnetism device 70F shown in FIG. 9F is similar to the device 70E shown in FIG. 9E. The difference is that the MCEM unit u1 is disposed around the core 53C1 rather than at the bottom of the recess 53B2.

Figure 10:
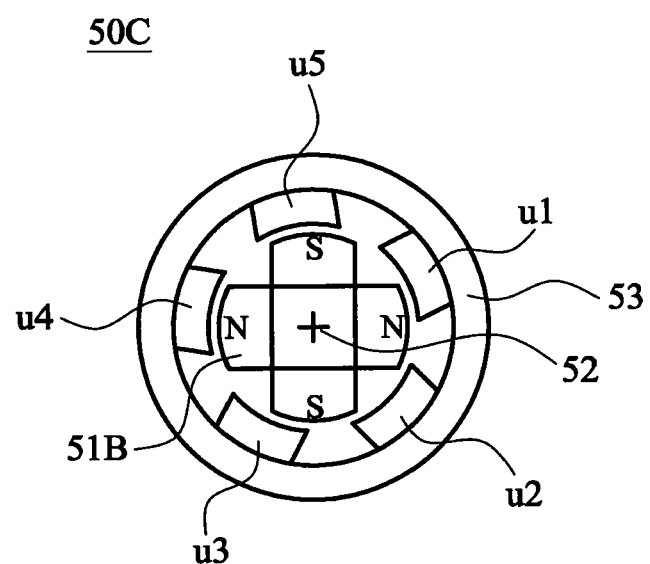
FIG. 10 shows a rotating magnet heat-power conversion magnetism device including MCEM units with non-even number.

In FIG. 10, a rotating magnet heat-power conversion magnetism device 50C is similar to the device 50B as shown in FIG. 7C. The difference is that the number of the MCEM units is non-even number. Heating the MCEM units u1, u5, u4, u3, and u2 sequentially and cooling the other MCEM units will cause the magnet 51B to rotate along the axis 52 in a clockwise direction.

Figure 11A:
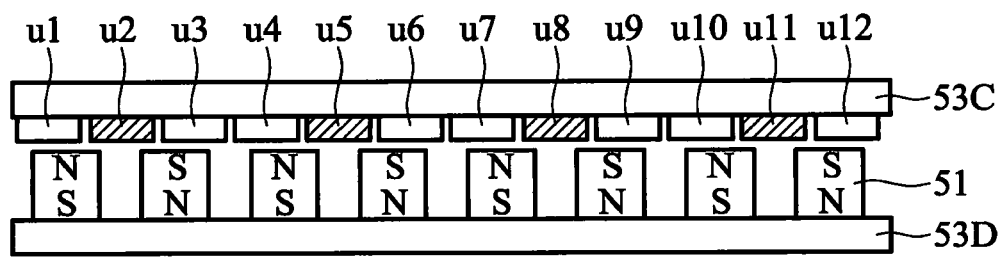
FIGS. 11A and 11B show cross-sectional views of a heat-power conversion magnetism device in straight-line arrangement.
Figure 11B:
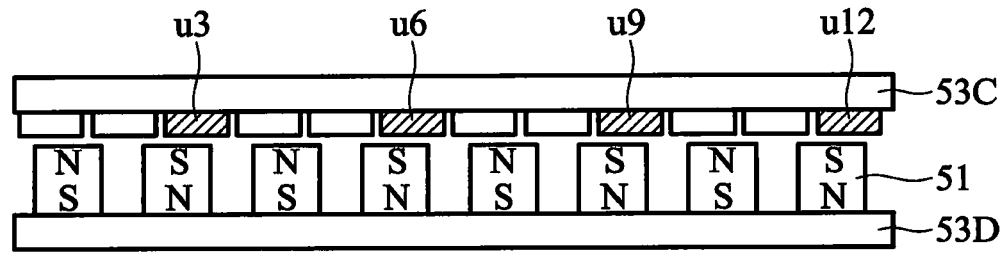

As shown in FIGS. 11A and 11B, a heat-power conversion magnetism device 80 includes two plates 53C and 53D which can move relatively. Twelve MCEM units u1-u12 are disposed on the lower face of the plate 53C, and eight magnets 51 are disposed at the upper face of the plate 53D so that the MCEM units and the magnets face each other.

FIG. 11A shows a neutral position when four MCEM units u2, u5, u8, and u11, as marked by shadow in the drawing, are heated at the temperature above the Curie temperature thereof. In FIG. 11B, the plate 53D tends to move in a left direction when the MCEM units u3, u6, u9, and u12 are heated at the temperature above the Curie temperature thereof.

Figure 12A:
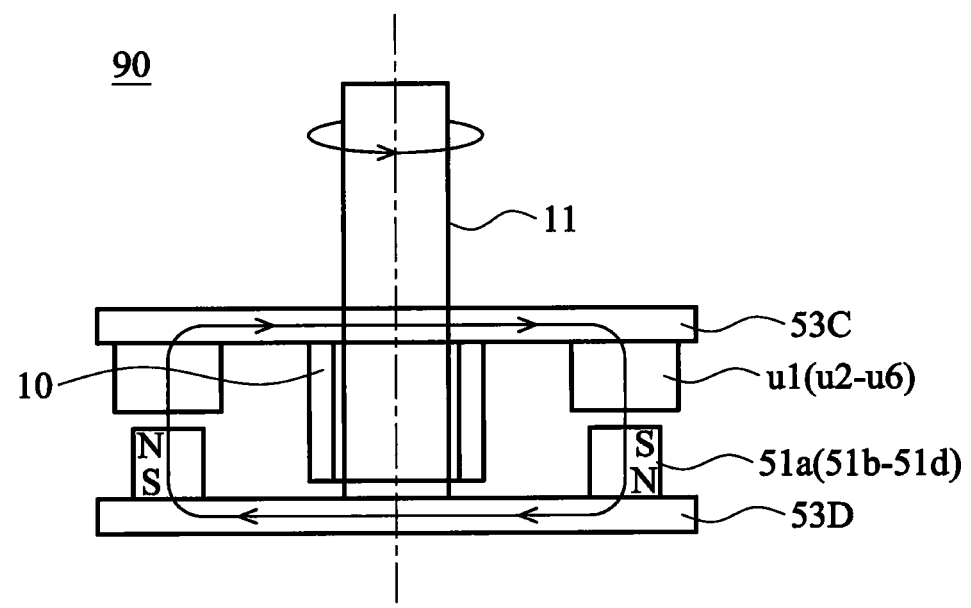
FIGS. 12A-12C show a heat-power conversion magnetism device according to the present invention.
Figure 12B:
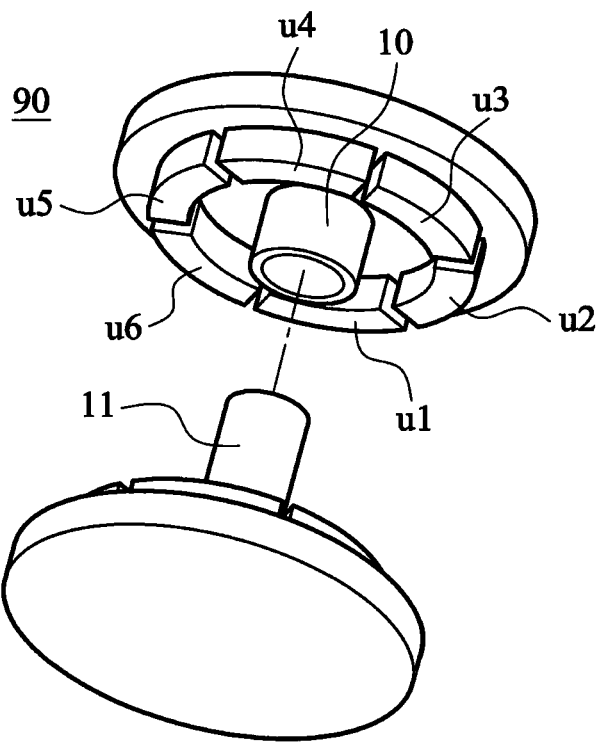
Figure 12C:
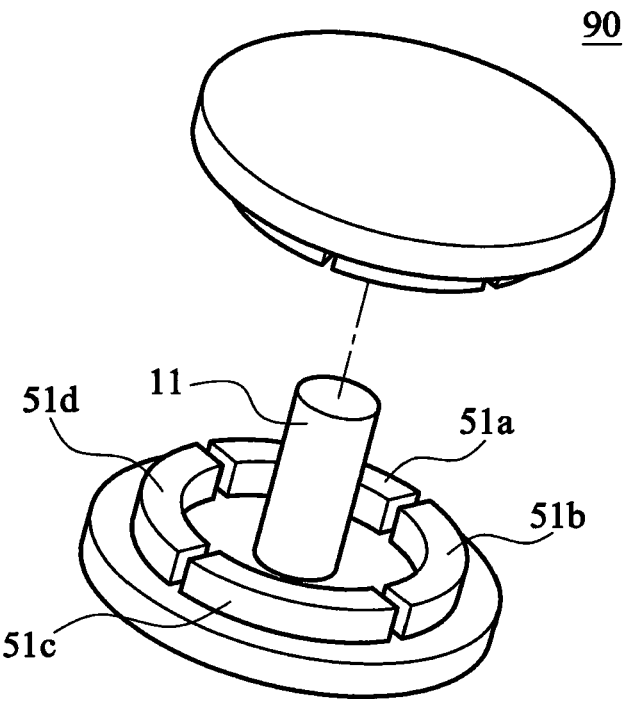

FIGS. 12A-12C show a heat-power conversion magnetism device 90. As shown in the drawings, four magnet poles 51a, 51b, 51c, and 51d and six MCEM units u1-u6 are arranged in an axial direction. The MCEM units u1-u6 can be heated at the temperature above the Curie temperature thereof so that the shaft 11 rotates with the plate 53D by the bearing 10 connected to the plate 53C.

Figure 13:
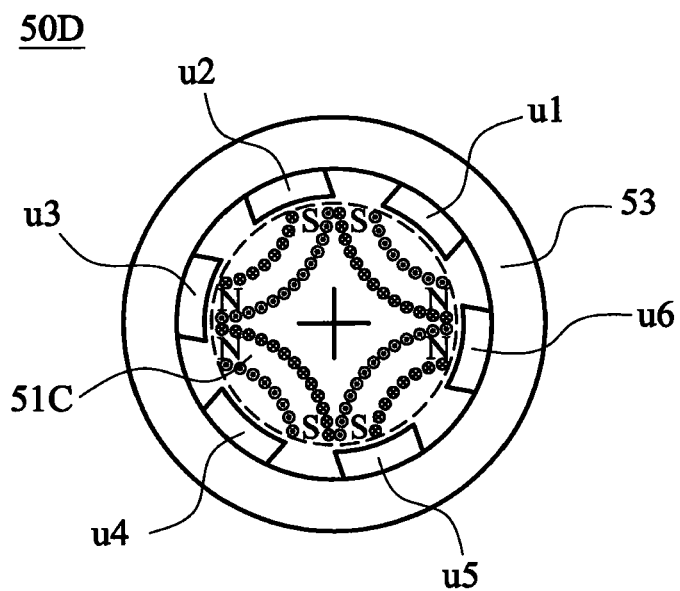
FIG. 13 shows a heat-power conversion magnetism device according to the present invention.

FIG. 13 shows a rotating magnet heat-power conversion magnetism device 50D. The device 50D is similar to the device 50B as shown in FIG. 7A. The difference is that a superconductor coil magnet 51C is presented. There are two benefits of using the superconductor coil magnet: (1) much higher magnetic field density (larger than 5 Telsa) to be generated; and (2) magnetic field density which is controllable by changing the electrical current.

Figure 14A:
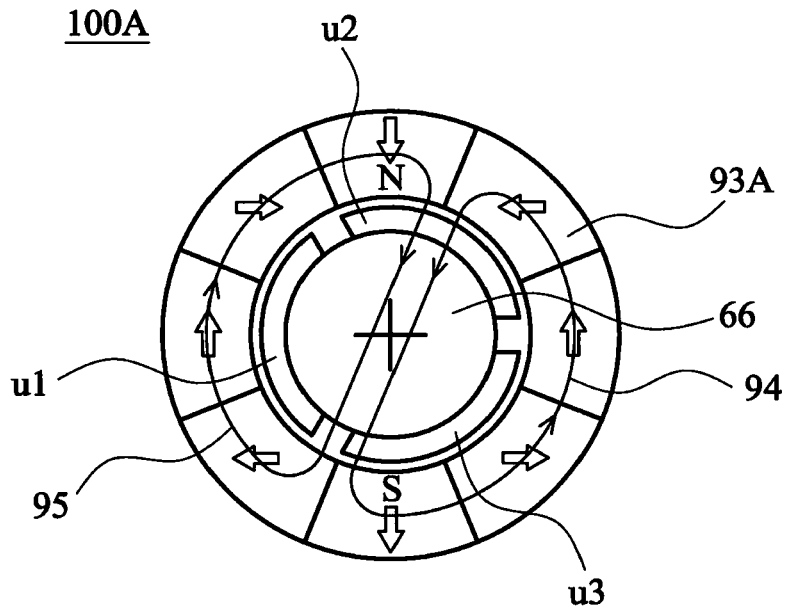
FIGS. 14A-14D show cross-sectional views of embodiments of a rotating magnet heat-power magnetism conversion device.

FIG. 14A shows a rotating magnet heat-power conversion magnetism device 100A, which takes an embodiment of a permanent magnet array as magnetic field source.

The device 100A includes a Halbach magnet ring 93A which is a kind of permanent magnet array with eight segments with special magnetization vectors indicated by arrows shown in FIG. 14A. Two equivalent magnetic poles are generated in the center space of the Halbach magnet ring 93A. A magnet 66 made of a permeability magnetic material is disposed in the center space of the Halbach magnet ring 93A. MCEM units u1-u3 are disposed at the outer surface of the magnet 66. Multi paths of magnetic flux are generated, but only two magnetic flux paths 94 and 95 are shown in FIG. 14A.

The Halbach magnet ring 93A can enhance the center magnetic field strength, and the segments thereof can guide most of magnetic flux paths through the center space of the ring 93A to provide stronger magnetic flux density to 2-3 Tesla. The magnetic flux density is presented as the following equation:

$$B=Br*(\ln(Ro/Ri)) \quad (4)$$

wherein B is the magnetic flux density; Br is the remanence of the material of the Halbach magnet ring; Ro is the radius of the outer dimension of the Halbach magnet ring; and Ri is the radius of the inner dimension of the Halbach magnet ring.

Figure 14B:
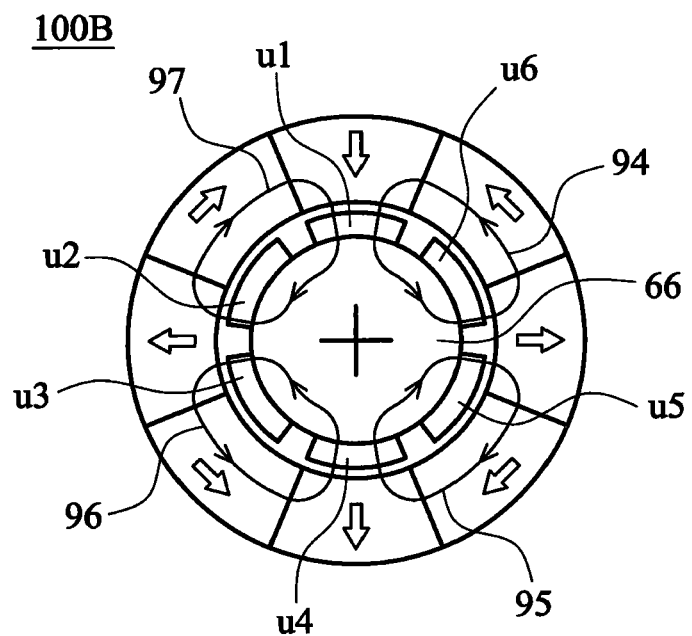

In FIG. 14B, a device 100B is similar to the device 100A shown in FIG. 14A. The difference is that six MCEM units u1-u6 are disposed at the outer surface of the magnet 66 and that four equivalent magnetic poles are generated in the center space of the Halbach magnet ring 93B, which is a kind of permanent magnet array with eight segments with special magnetization vector indicated by arrows shown in FIG. 14B. Multi paths of magnetic flux are generated, but only four magnetic flux paths 94, 95, 96 and 97 are shown in FIG. 14B.

Figure 14C:
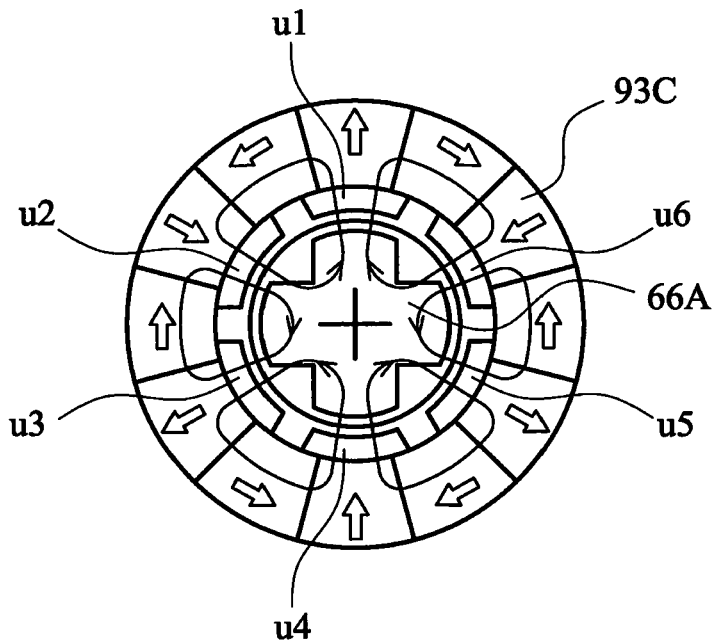

In FIG. 14C, a device 100C is similar to the device 100B shown in FIG. 14B. The difference is that six MCEM units u1-u6 are disposed at the inner surface of the Halbach magnet ring 93C, which is a kind of permanent magnet array with twelve segments with special magnetization vector indicated by arrows shown in FIG. 14C, and that six equivalent magnetic poles are generated in the center space of the Halbach magnet ring 93C.

Figure 14D:
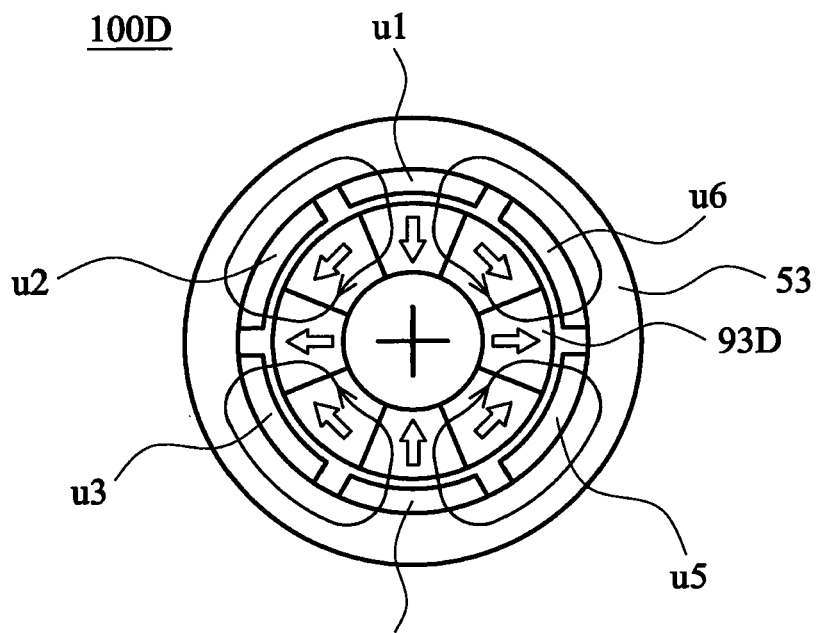

In FIG. 14D, a device 100D includes a Halbach magnet ring 93D which generates four equivalent magnetic poles in the center space thereof. The Halbach magnet ring 93D, which is a kind of permanent magnet array with eight segments with special magnetization vector indicated by arrows shown in the drawing, is disposed at the center space of the sleeve 53 and six MCEM units u1-u6 are disposed at the inner surface of the sleeve 53.

Figures 15A, 15B:
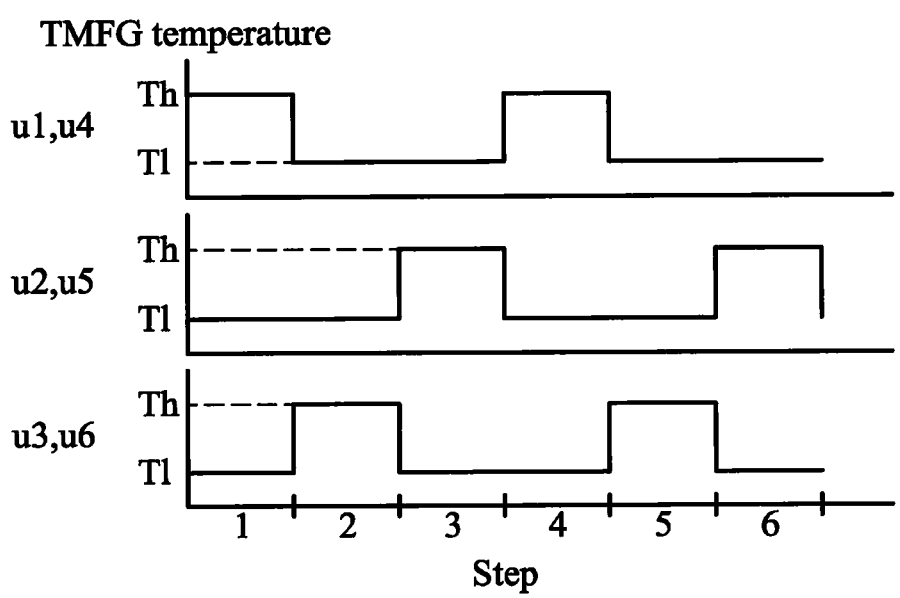
FIGS. 15A-15D show steps of heating and cooling the MCEM units for controlling rotation of a heat-power magnetism conversion device.

FIGS. 15A-15D show the steps of heating and cooling the MCEM units for controlling the rotation of the heat-power conversion magnetism device. The device 50B shown in FIG. 7A is taken as an example. The rotation of the device 50B can be controlled by heating or cooling the MCEM units u1-u6. As shown in FIG. 15A, heating or cooling the MCEM units u1-u6 allows us to control the rotation direction.

Figure 15C:
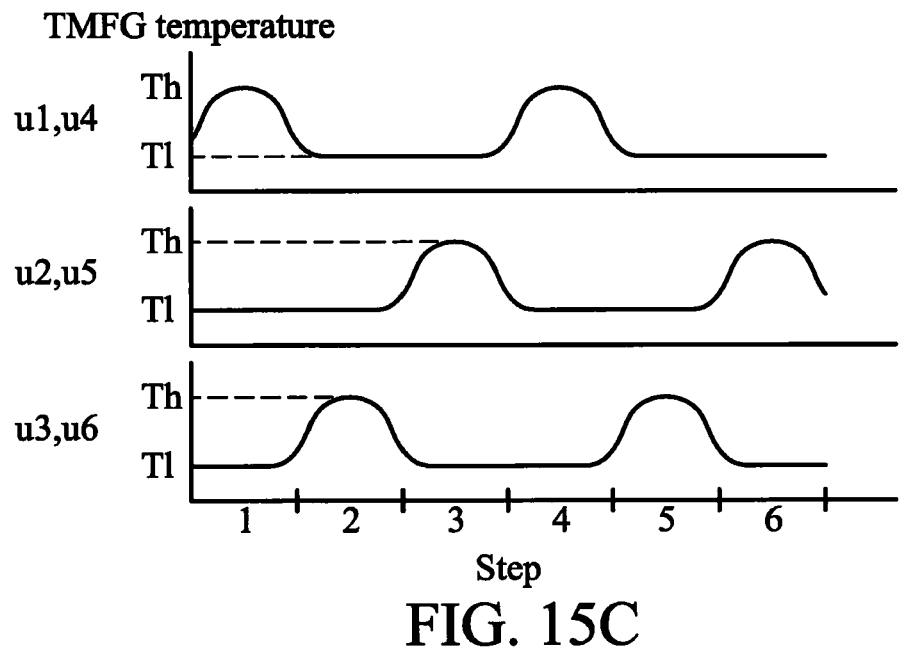
Figure 15D:
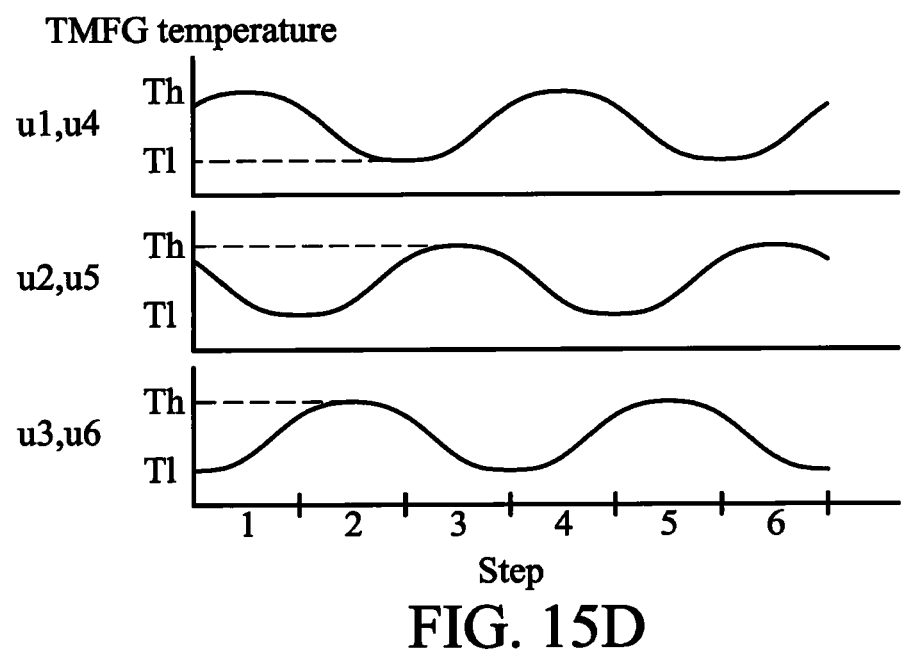

FIGS. 15B-15D show three kinds of temperature waveforms for heating and cooling the MCEM units u1-u6 of the device 50B. To be understood, the heating and cooling waveform can be any kind of profile. The proper profile of the temperature waveform is chosen based on the torque output for different kinds of applications. For example, the temperature waveform in FIG. 15B can deliver the maximum power, and the temperature waveform in FIG. 15C can deliver the smooth power output. The sine temperature waveform is applied to have the most smooth power output in FIG. 15D.

A type of Active Magnetic Regenerator (AMR) thermal convection unit according to an embodiment of the invention is presented as below. In an AMR cycle, the magneto caloric effect material (MCEM) is not only magnetic refrigerant but also regenerator material. Thus, the irreversible thermal loss can be reduced.

FIGS. 16A, 16B, 16C, and 16D show the back-and-forth processes of a regeneration thermal convection unit μ100. The regeneration thermal convection unit μ100 includes a container μ011, a hot side chamber μ016, and a cold side chamber μ017. A porous structure μ012 made of MCEM is disposed in the container μ011. The hot side and cold side chambers μ016 and μ017 are connected to the container μ017 respectively, so that working fluid μ015 can flow between the container μ011 and the chambers μ016 and μ017.

Figure 16A:
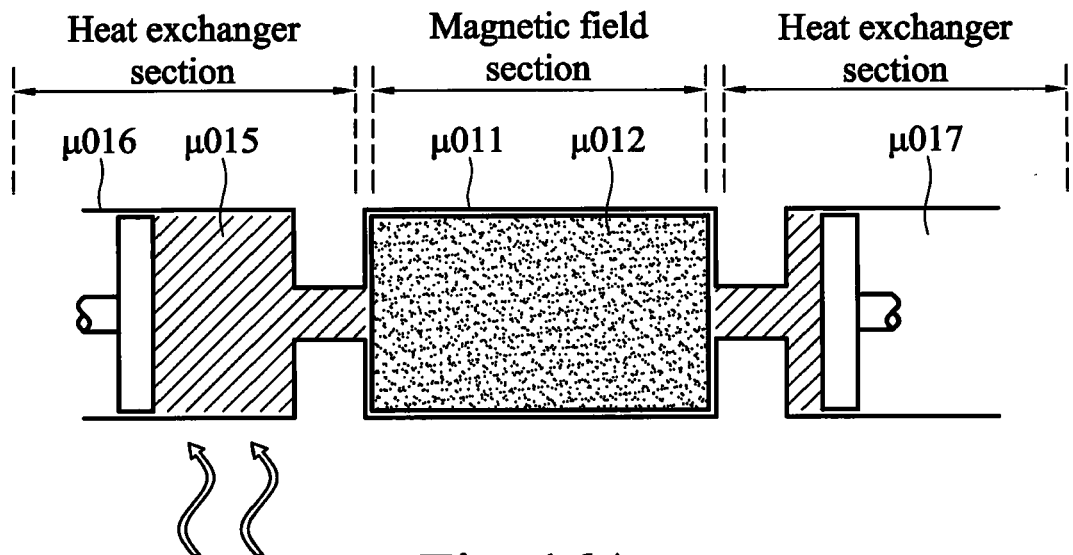
FIGS. 16A-16D show back-and-forth processes of a regeneration thermal convection unit.
Figure 16B:
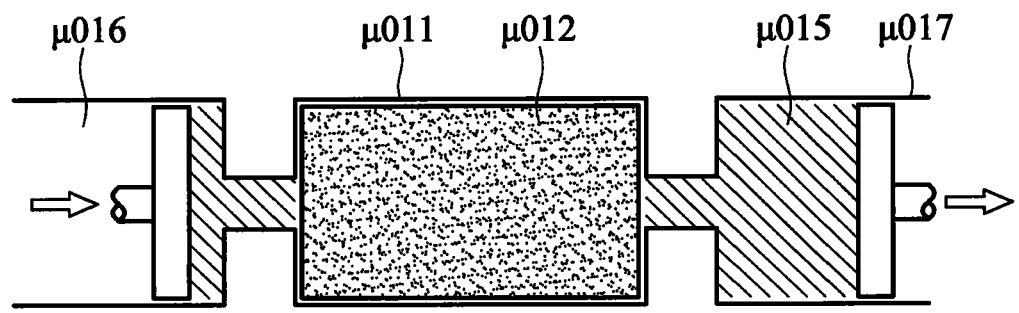
Figure 16C:
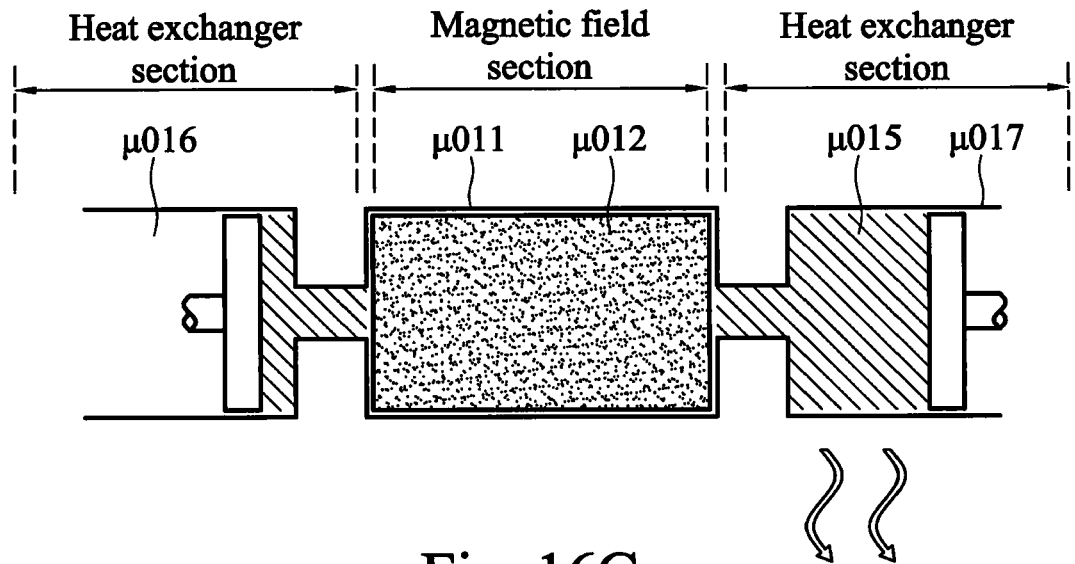
Figure 16D:
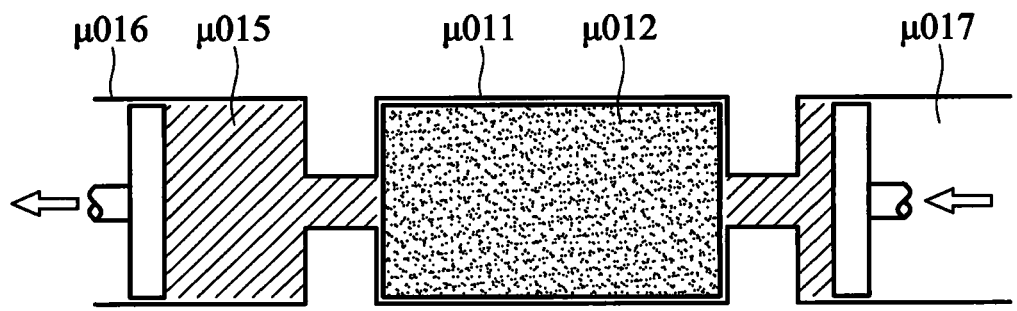

As shown in FIG. 16A, hot thermal energy is applied to the hot side chamber μ016 so that the working fluid μ015 in the hot side chamber can be heated. In FIG. 16B, the heated working fluid μ015 is pushed through the porous structure μ012 so that the magnetic field thereof can be changed. In FIG. 16C, cold thermal energy is applied to the cold side chamber μ017, and then the working fluid μ015 in the cold side chamber can be cooled. In FIG. 16D, the cooled working fluid μ015 is pushed through the porous structure μ012 again so that the magnetic field thereof can be changed.

Figure 1:
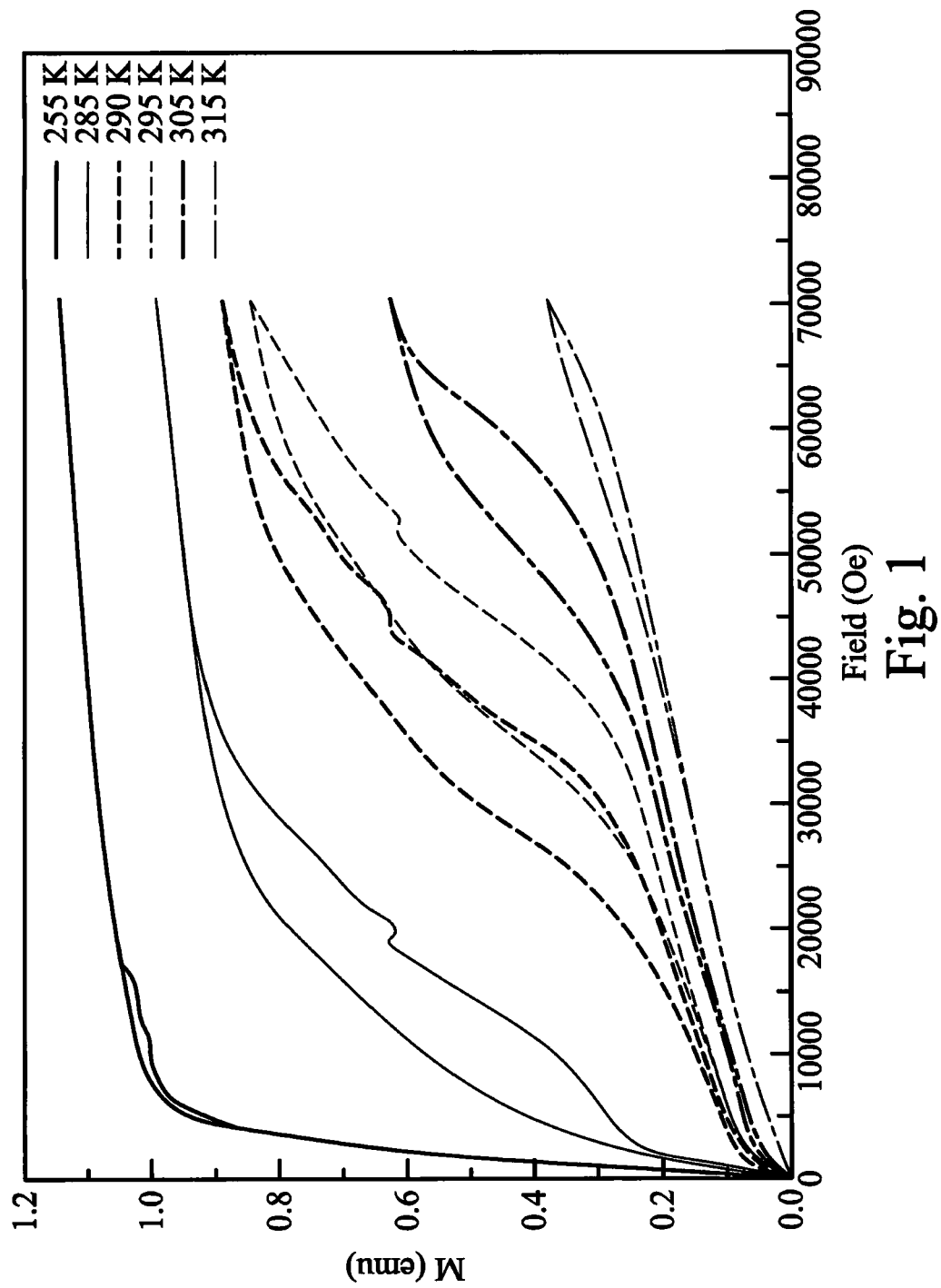
FIG. 1 shows magnetization curves of Gadolinium (Gd)
Figure 2:
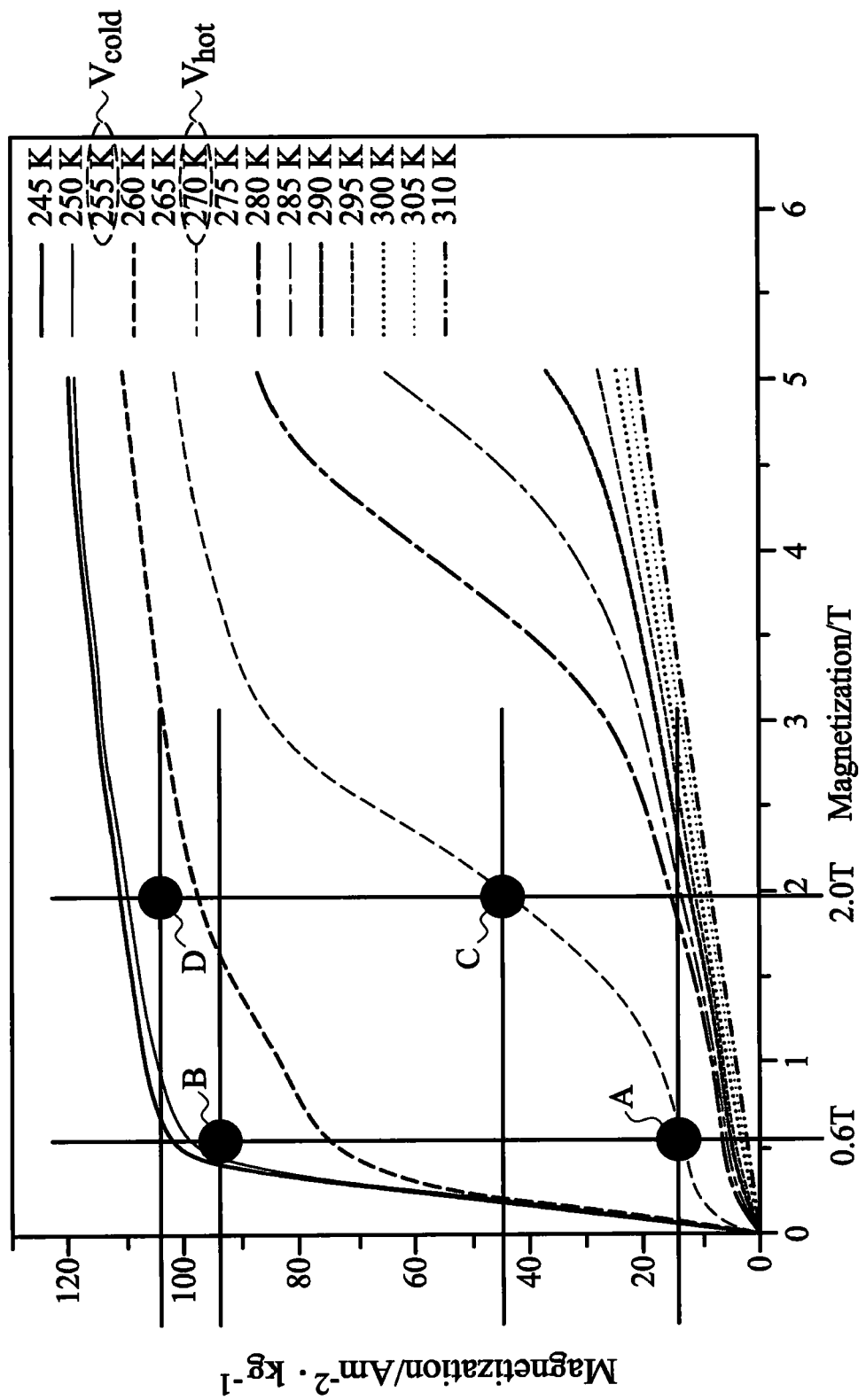
FIG. 2. shows magnetization curves of $Gd_5Si_2Ge_2$.
Figure 3:
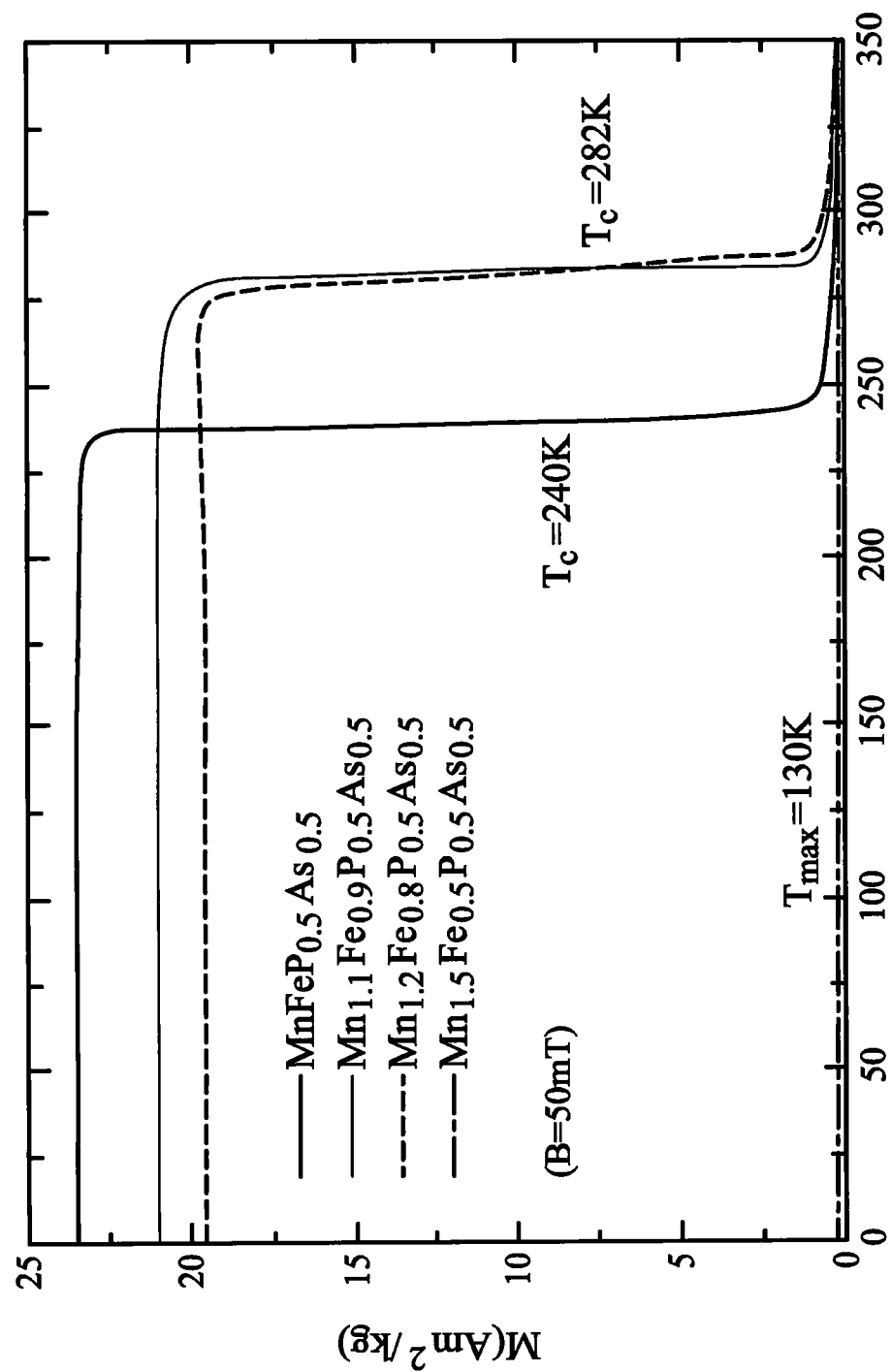
FIG. 3. shows magnetization curves of $(Mn, Fe)_2P_{0.5}As_{0.5}$.
Figure 4:
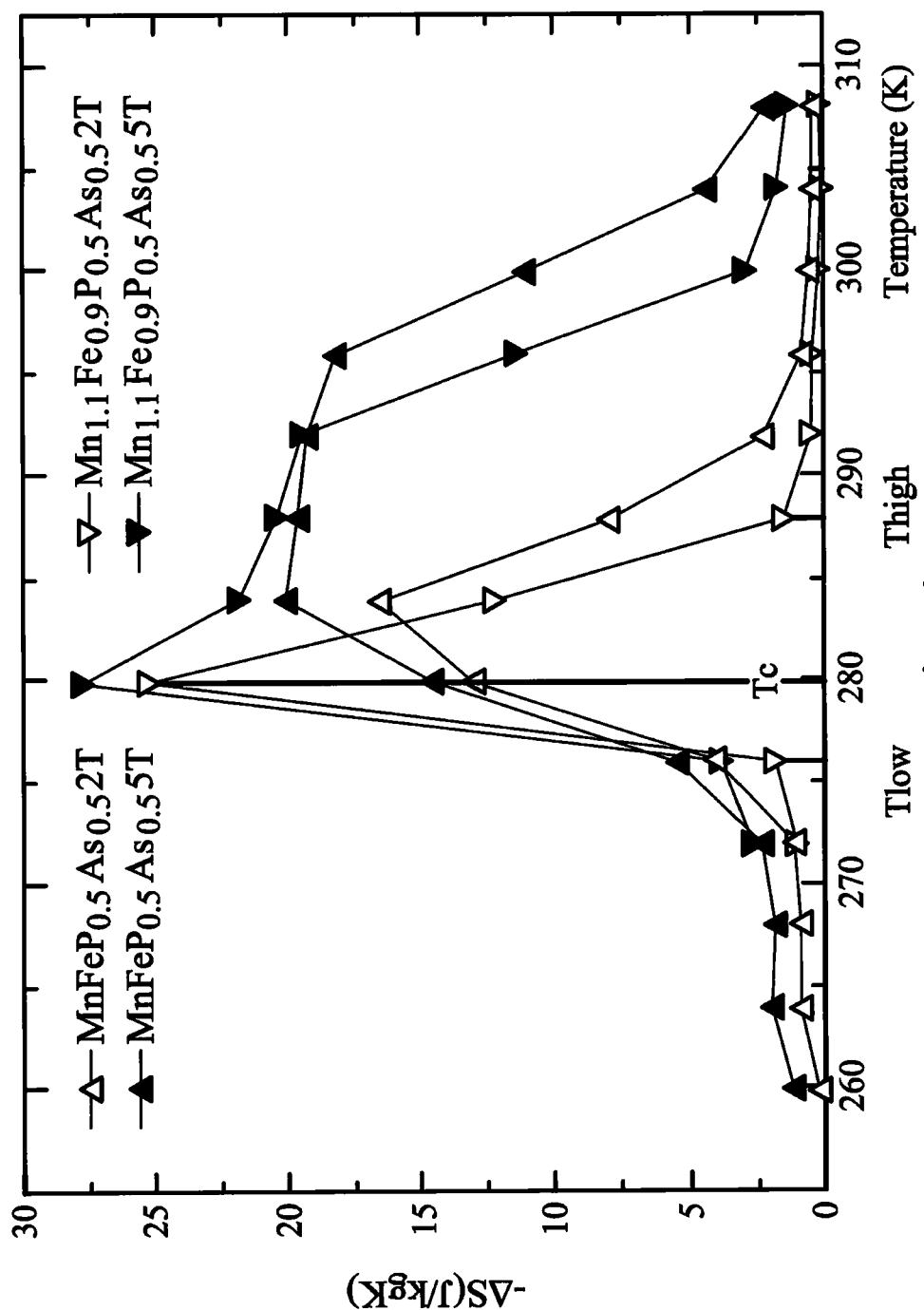
FIG. 4. shows MCE of MnFePAs in 2T and 5T magnetic field.

It should be noted that the temperature difference of the system for converting energy should be larger than the temperature for changing the magnetic phase of the MCEM. Generally, the temperature difference of day and night is sometimes larger than 40 Kelvin. Again referring to FIG. 4, the temperature difference of the MCEM, such as $MnFeP_{0.5}As_{0.5}$, for changing the magnetic phase thereof is only about 12-15 Kevin. If a hot source is arranged to absorb the heat from the environment in the day time and a cold source is arranged to expel the heat to the cooler environment in the night time, the temperature difference between the hot and cold sources will be as large as 40 Kevin and enough to change the magnetic field of the MCEM, i.e. $MnFeP_{0.5}As_{0.5}$. The heat-power conversion magnetism device can be driven by the temperature difference in the environment.

To sum up, while the invention has been described by way of example and in terms of preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat-power conversion magnetism device comprising:
   a sleeve;
   a plurality of protrusions on an inner face of the sleeve;
   a plurality of recesses, each recess formed between two adjacent protrusions;
   a plurality of magnets, each magnet disposed at the bottom of a recess;
   a rotating core disposed at a center area of the sleeve;
   a plurality of magneto caloric effect material units disposed between the sleeve and the core;
   wherein one of the magneto caloric effect material units is disposed on a protrusion.

2. A heat power conversion magnetism device comprising:
   a sleeve;
   a plurality of protrusions on an inner face of the sleeve;
   a plurality of recesses, each recess formed between two adjacent protrusions;
   a plurality of magnets, each magnet disposed on a protrusion;
   a rotating core disposed at a center area of the sleeve;
   a plurality of magneto caloric effect material units, wherein one of the plurality of magneto caloric effect material units is disposed at the bottom of one of the plurality of recesses.

* * * * *